United States Patent [19]

Stakhov

[11] 4,148,074
[45] Apr. 3, 1979

[54] CATHODE-RAY TUBE DISPLAY

[76] Inventor: Alexei P. Stakhov, ulitsa Chekhova, 49, kv. 16, Taganrog Rostovskoi oblasti, U.S.S.R.

[21] Appl. No.: 861,413

[22] Filed: Dec. 16, 1977

[30] Foreign Application Priority Data

Dec. 22, 1976 [SU] U.S.S.R. ............................ 2433409[I]

[51] Int. Cl.$^2$ .............................................. H04N 7/02
[52] U.S. Cl. .................................. 358/242; 235/92 N; 358/139
[58] Field of Search ............. 364/486, 521; 235/92 N, 235/92 EA, 92 ET, 92 GD, 92 BQ, 92 BN, 92 DP, 92 MB, 92 MS; 358/139, 242

[56] References Cited

U.S. PATENT DOCUMENTS

| | | | |
|---|---|---|---|
| 3,014,662 | 12/1961 | Borders | 235/92 DP |
| 3,673,325 | 6/1972 | Uphoff | 358/242 |
| 4,019,040 | 4/1977 | Thompson | 235/92 N |

*Primary Examiner*—Robert L. Griffin
*Assistant Examiner*—Joseph A. Orsino, Jr.
*Attorney, Agent, or Firm*—Fleit & Jacobson

[57] ABSTRACT

A cathode-ray tube display comprising a control unit whose intensity control output, horizontal sweep control output and vertical sweep control output are coupled, respectively, to the data input of an intensity control unit, to the counting input of a first Fibonacci code pulse counter, and to the counting input of a second Fibonacci code pulse counter, the output of the intensity control unit being coupled to the data input of a cathode-ray tube, data outputs of the first and second Fibonacci code pulse counters being coupled, respectively, to the inputs of first and second pulse amplifiers via first and second Fibonacci code digital-analog converters, fault acknowledgement outputs of the first and second Fibonacci code pulse counters being coupled via a checking OR gate to the fault acknowledgement input of the control unit, and transient outputs of the first and second Fibonacci code pulse counters being coupled via a blanking OR gate to the blanking input of the intensity control unit.

1 Claim, 3 Drawing Figures

CATHODE-RAY TUBE DISPLAY

FIELD OF THE INVENTION

This invention relates to computing machinery and more particularly to cathode-ray displays. It is applicable to displays and Digital TV systems.

BACKGROUND OF THE INVENTION

Known in the art are cathode ray-tube displays (cf. Kutsenko, Polosjants, Stupitsyn, Minicomputers for Applied Physics, Moscow, 1975, pp. 158-164 [in Russian]) utilizing cathode-ray tubes with magnetic or electrostatic deflection systems and digital beam deflection as well.

In these displays, the data input of a cathode-ray tube is coupled to an output of a control unit via an intensity control unit, whereas vertical and horizontal sweep inputs of the cathode-ray tube are coupled to vertical and horizontal sweep channels, respectively. Each channel incorporates a pulse counter, a digital-analog converter and a pulse amplifier and is coupled to respective remaining output of the control unit. The pulse counters and digital-analog converters of such displays operate to handle conventional binary code data.

The described displays are disadvantageous, since during pulse counting an uncontrollable surge of current or voltage occurs at the output of the digital-analog converter when adjacent codewords (for example 0 1 1 ... 1 and 1 0 0 ... 0) are to be replaced. This shows that a powerful transient takes place in the elements of such a display due to the fact that the digit positions of the digital-analog converter are switched over at different times; as a result, the quality of the pattern on the CRT screen deteriorates.

To overcome this harmful effect, the digital-analog converter is provided with a smoothing circuit or the initiation of the electron beam is accomplished under synchronous control. This means that the beam is triggered at time points corresponding to the termination of transients, while time intervals between adjacent beam initiations are chosen depending on the duration of a transient occurred under the most unfavourable conditions. Note that the two methods ensure a better pattern quality but tend to decrease the sweep speed of the beam.

An object of the present invention is to provide for an increased sweep speed of the electron beam and better pattern quality in cathode-ray tube displays by smoothing transients that take place in the components of their digital-analog converters.

Another object of the invention is to create pulse counters and digital-analog converters which could perform Fibonacci code operations.

Still another object of the invention is to provide for a cathode-ray tube display which could be turned off in the case of improper operation of its pulse counters and which is capable of blanking the electron beam during transients.

BRIEF DESCRIPTION OF THE INVENTION

According to the invention, there is provided a cathode-ray tube display comprising a control unit whose intensity control unit is coupled to the data input of an intensity control unit having its output coupled to the data input of a cathode-ray tube, a horizontal sweep control output of the control unit being coupled to a horizontal sweep input of the cathode-ray tube via one pulse counter, via one digital-analog converter and via one pulse amplifier, all connected serially, a vertical sweep control output of the control unit being coupled to a vertical sweep input of the cathode-ray tube via the other pulse counter, via the other digital-analog converter and via the other pulse amplifier, all connected serially, fault acknowledgement outputs of the pulse counters being coupled to respective inputs of a checking OR gate whose output is coupled to the fault acknowledgement input of the control unit, transient outputs of the pulse counters being coupled to respective inputs of a blanking OR gate whose output is coupled to the blanking input of the intensity control unit, the pulse counters and the digital-analog converters being provided with the ability to perform Fibonacci code operations.

The cathode-ray tube display offered provides for an increased sweep speed of the electron beam and a better pattern quality.

BRIEF DESCRIPTION OF THE ACCOMPANYING DRAWINGS

Other objects and advantages of the invention will appear from the following detailed description relating to a preferred embodiment of the invention taken in connection with the accompanying drawings, in which.

DETAILED DESCRIPTION OF THE INVENTION

Figure 1:
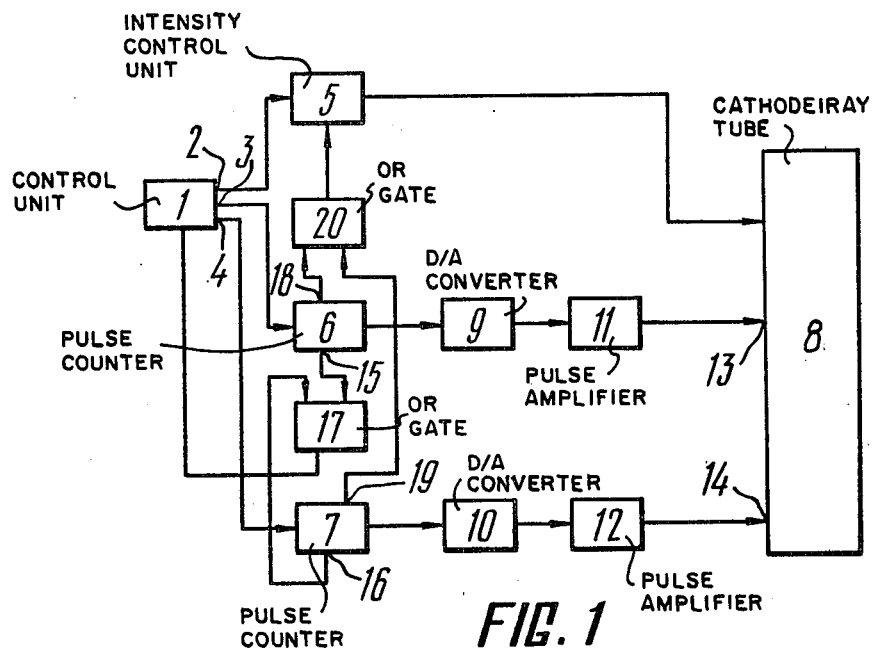
FIG. 1 is a block diagram of a cathode-ray tube display, according to the invention.

Referring to FIG. 1 there can be seen a block diagram of the cathode-ray tube display of the invention incorporating a control unit 1 adapted to control the operation of the display and its components. The control unit 1 is provided with an intensity control output 2; a horizontal sweep control output 3 and a vertical sweep control unit 4 which are coupled, respectively, to the data input of an intensity control unit 5, to the counting input of the pulse counter 6 and to the counting input of the pulse counter 7. The pulse counters 6 and 7 function to perform Fibonacci code operations. The output of the intensity control unit 5, which may be, for example, a modulator, is coupled to the data input of a cathode-ray tube 8. Data outputs of the pulse counters 6 and 7, which are multidigit outputs, are coupled, respectively, to multidigit inputs of digital-analog converters 9 and 10 which can operate to convert Fibonacci p-codes to analog quantities such as voltages or currents. The inputs of the digital-analog converters 9 and 10 are multidigit ones, while their outputs are coupled, respectively, to the inputs of pulse amplifiers 11 and 12 whose outputs are applied to a horizontal sweep input 13 and to a vertical sweep input 14 of the cathode-ray tube 8.

Fault acknowledgement outputs 15 and 16 of the pulse counters 6 and 7 are coupled to the inputs of a checking OR gate 17 which detects fault signals produced in said counters when they operate improperly. The output of the checking OR gate 17 is coupled to the fault acknowledgement input of the control unit 1. Transient inputs 18 and 19 of the pulse counters 6 and 7 are coupled to the inputs of a blanking OR gate 20 adapted to detect signals that indicate that transients occur in the pulse counters 6 and 7. The output of the blanking OR gate 20 is coupled to the blanking input of the intensity control unit 5.

Figure 2:
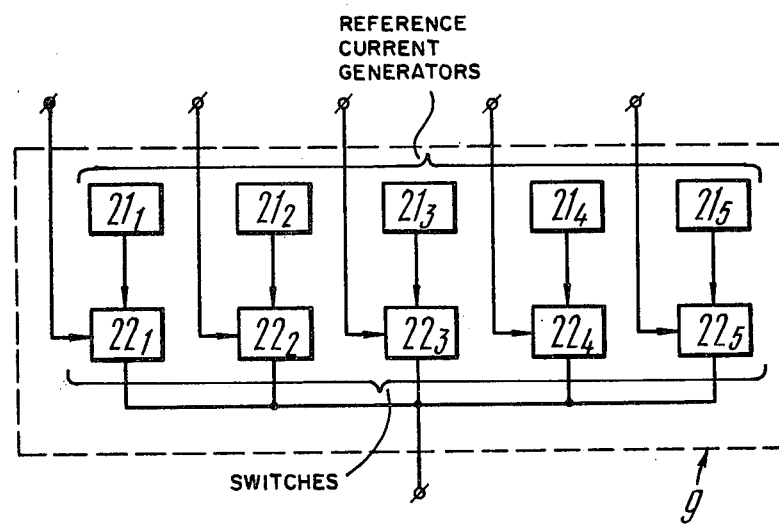
FIG. 2 is a block diagram of a digital-analog converter, according to the invention, which performs Fibonacci code operations.

FIG. 2 illustrates a block diagram of a digital-analog converter 9 of the invention which operates to convert n-digit Fibonacci p-codes (n = 5) to current values and to control the electron beam of the cathode-ray type 8 with a magnetic deflection system. The digital-analog converter 9 incorporates five reference current generators $21_1$–$21_5$ which produce reference currents whose values are proportional to Fibonacci p-numbers. The outputs of said generators are coupled to respective inputs of identical switches $22_1$–$22_5$ which, when energized, forward current signals to the output of the digital-analog converter 9. A plurality of other outputs of the switches $22_1$–$22_5$ constitutes a multidigit input of the digital-analog converter 9.

A digital-analog converter 10 is designed in a similar manner.

Figure 3:
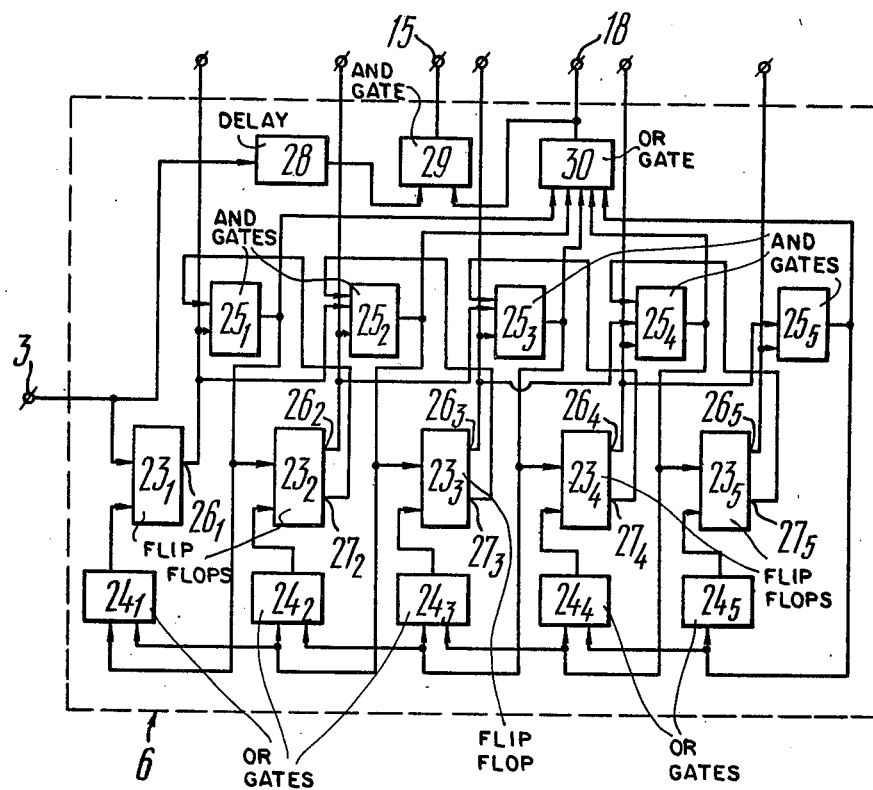
FIG. 3 is a block diagram of a pulse counter, according to the invention, which performs Fibonacci code operations.

FIG. 3 illustrates a block diagram of the pulse counter 6 which handles Fibonacci p-codes (p = 1). Said counter incorporates five counting stages (n = 5), each lth counting stage being provided with a flip-flop $23_l$, an OR gate $24_l$ and an AND gate $25_l$, where l = 1,2 ... n.

In each lth counting stage (with l equal, for example, to 2), the "0" input of a flip-flop $23_2$ is coupled to the output of an OR gate $24_2$, while the "1" output $26_2$ of a flip-flop $23_2$ is coupled to one of the inputs of an AND gate $25_2$ and to one of the inputs of an AND gate $25_{l+1}$, i.e., AND gate $25_3$, whose output coupled to one of the inputs of an OR gate $24_3$ and to the remaining input of an OR gate 24, i.e., OR gate $24_2$. The "0" output $27_2$ of the flip-flop $23_2$ is coupled to the remaining input of an AND gate $25_{l-1}$, i.e., AND gate $25_1$.

The complementing input of a flip-flop $23_1$ of a first counting stage serves as the counting input of the pulse counter 6 (FIG. 1), coupled to the horizontal sweep control input 3 of the control unit 1, whereas the complementing input of the flip-flop 23 of each following counting stage is coupled to the output of the AND gate 25 of the preceding counting stage; for example, the complementing input of the flip-flop $23_2$ is coupled to the output of the AND gate $25_1$.

The pulse counter 6 also includes a delay 28 used to provide for a pulse delay whose length is equal to a maximum transient time noted in the pulse counter 6. The input of the delay 28 is coupled to the complementing input of the flip-flop $23_1$, while the output of said delay is coupled to one of the inputs of a checking AND gate 29 of the pulse counter 6. The output of the checking AND gate 29 is used as the fault acknowledgement output 15 of the pulse counter 6, while the other input of said gate is coupled to the output of a transient-detecting OR gate 30, said output being used as the transient output 18 of the pulse counter 6. Each of the inputs of the transient-detecting OR gate 30 is coupled to the output of one of the AND gates $25_1$–$25_5$.

The pulse counter 7 is designed in a similar manner.

Prior to describing the operation of the cathode-ray tube display of the invention, it is useful to briefly consider certain basic concepts of the theory of Fibonacci p-codes as disclosed, for example, by A. P. Stakhov's "An Introduction to the Algorithmic Theory of Measurements", Moscow, 1977 (in Russian).

An n-digit Fibonacci p-code of some natural number N can be represented by the following sum:

$$N = \sum_{i=0}^{n-1} a_i \phi_p(i) \qquad (1)$$

where
i is the no. of a bit position;
$a_i$ is a binary digit in the ith position of the code;
$\phi_p i$ is the weight of the ith position given by the relation:

$$\phi_p(i) = \begin{cases} 0 \text{ with } i < 0 \\ 1 \text{ with } i = 0 \\ \phi_p(i-1) + \phi_p(i-p-1) \text{ with } i > 0 \end{cases} \qquad (2)$$

Using Fibonacci p-codes, some N can be represented on a multiple basis. For example, with p equal to 1, the number 10 can be represented by the following Fibonacci 1-codes:

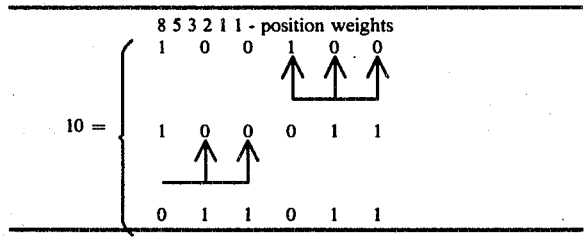

Amongst different Fibonacci p-codes of some N there exists one and only one Fibonacci p-code which includes, in any group consisting of (p+1) successive code positions, not more than one unit position. Such a Fibonacci p-code is called the normal (minimal) Fibonacci p-code of the given N.

Another distinctive feature of Fibonacci p-codes is that during pulse counting the transfer from the normal Fibonacci p-code of the number N to the normal Fibonacci p-code of the number N+1 can be carried out through abnormal Fibonacci p-codes of the number N+1. For example, the transfer from the normal Fibonacci 1-code of the number 54 to the normal Fibonacci 1-code of the number 55 is as follows:

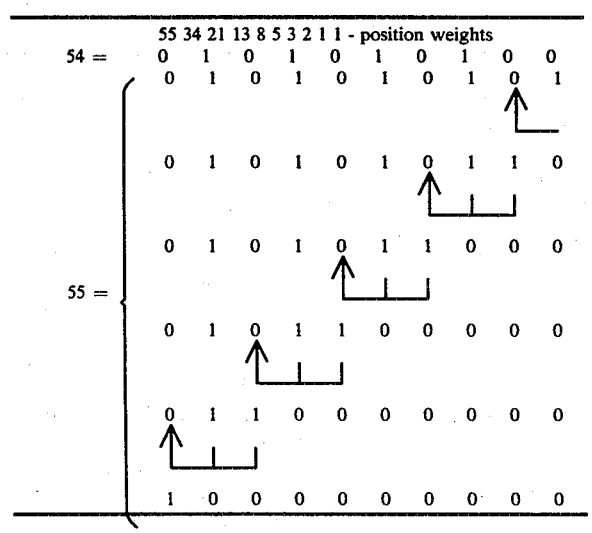

The sign ⌊⌊⌋ is used to designate the convolution operation performed on bit positions.

The cathode-ray tube display 8 (FIG. 1) of the invention operates basically the same as the known displays. Delivered from the horizontal sweep control input 3 and the vertical sweep control input 4 of the control unit 1 to respective counting inputs of the pulse counters 6 and 7 are count pulses whose repetition rate determines horizontal and vertical sweep speeds of the electron beam. The intensity control output 2 produces a modulating signal applied to the input of the intensity control unit 5 to convey data to be displayed on the screen of the cathode-ray tube 8. Data available from the outputs of the pulse counters 6 and 7 in the form of a multidigit Fibonacci p-code passes to the inputs of the digital-analog converters 9 and 10 whose outputs produce electric signals proportional to the numbers represented by multidigit Fibonacci p-codes accepted by the digital-analog converters 9 and 10. The pulse amplifiers 11 and 12 operate to amplify these signals which then are routed to the horizontal sweep input 13 and to the vertical sweep input 14 of the cathode-ray tube 8 with the result that the beam is deflected in horizontal and vertical directions and its intensity control is effected. When adjacent Fibonacci p-codes (for example, Fibonacci 1-codes 01010 and 10000) contained in the pulse counters 6 and 7 are replaced, then the output 18 or 19 of one of said counters in which code replacement takes place produces a logic 1 passed via the blanking OR gate 20 to the blanking input of the intensity control unit 5 which operates to blank the beam for a transient time available and does so until the termination of said logic 1 at its input. This prevents false data generated in the digital-analog converters 9 and 10 due to transients from going to the screen of the cathode-ray tube 8. If the pulse counter 6 or 7 fails during operation, then the fault acknowledgement output 15 or 16 produces a logic 1 passed via the checking OR gate 17 to the control unit 1, which makes the display inoperative until the removal of a failure.

The digital-analog converter 9 (FIG. 2), which is able to handle Fibonacci p-codes, operates as follows. In their initial position, all the switches $22_1$–$22_5$ are disabled and no reference currents from the reference current generators $21_1$–$21_5$ are transferred to the output of the digital-analog converter 9. When a Fibonacci p-code combination is applied to the multidigit input of the digtal-analog converter 9, then only those of the switches $22_1$–$22_5$ are enabled whose inputs accept logic 1's corresponding to unit positions of the given Fibonacci p-code. A current signal now appears at the output of the digital-analog converter 9, whose value is proportional to the number represented by said Fibonacci p-code and available to the input of said converter 9.

The digital-analog converter 10 operates in a similar manner.

Given below is a more detailed description of the operation of the pulse counter 6 (FIG. 3). Before operation commences, all the flip-flops $23_1$–$23_5$ assume 0 states and no logic 1's are present at the outputs of the AND gates $25_1$–$25_5$ and at the transient output 18 and the fault acknowledgement output 15 of the pulse counter 6 as well. The first count pulse applied to the counting input of the pulse counter 6 sends the flip-flop $23_1$ to a 1 state. As a result, the codeword contained in the pulse counter 6 is converted to 00001, while a logic 1 appears at the output of the AND gate $25_1$ to toggle the flip-flop $23_2$ to a 0 state via the OR gate $24_1$ and to send the flip-flop $23_2$ to a 1 state. Said logic 1 then passes via the transient-detecting OR gate 30 to produce the first microtransient at the transient output 18. The first count pulse, like all succeeding ones, activates the delay 28 for a maximum transient time $\tau$. Thus, a codeword loaded in the pulse counter 6 upon the termination of the microtransient is represented as 00010. These actions constitute the convolution of bit positions. The second count pulse sends the flip-flop $23_1$ to a 1 state and the "1" output $26_1$ thereof produces a logic 1 which is routed via the AND gate $25_2$ and the transient-detecting OR gate 30 to the transient output 18. Also, said logic 1 is applied to the complementing input of the flip-flop $23_3$ to send the latter to a 1 state and is passed via the OR gates $24_1$, $24_2$ to the "0" set inputs of the flip-flops $23_1$, $23_2$ so that they take up 0 states. Upon the termination of this next microtransient, the codeword now available to the pulse counter 6 appears as 00100. The appearance of the next following count pulses results in further change of the states of the flip-flops $23_1$–$23_5$ as follows:

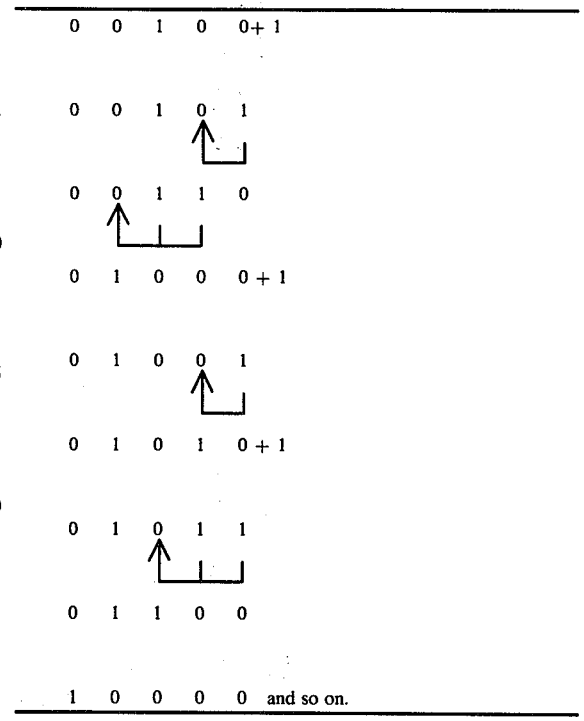

The convolution signals appear successively at the outputs of the AND gates $25_1$–$25_5$ and pass via the transient-detecting OR gate 30 to the transient output 18, these signals form all together a complete transient signal. A maximum number of convolutions equal to n/2 determines a transient time which is necessarily less than $\tau$. If a failure occurs in a certain component of the circuitry, for example, a discontinuity between the output of the AND gate $25_4$ and the complementing input of the flip-flop $23_5$, then a logic 1 is present continuously at the output of the AND gate $25_4$, which is being accepted by the control unit 1 as a transient; after a time interval of $\tau$ has elapsed, the output of the delay 28 produces a logic 1 which passes through the checking AND gate 29, appears at the fault acknonledgement output 15 and comes to the control unit 1 (FIG. 1) which makes the display inoperative until the removal of a failure. Since three bit positions involved in the convolution operation are checked at a time, the location of the failure in the pulse counter 6 can easily be detected, which ensures a simpler repair procedure for the display.

Also, simpler adjustment and metrological test procedures are attained for the digital-analog converters 9 and 10 due to the fact that reference currents of the reference current generators $21_1$–$21_5$ of the digital-analog converter 9 are proportional to Fibonacci p-numbers handled and a certain relationship exists between adjacent positions of a given Fibonacci p-code. During adjustment, it is necessary to select to a higher degree of accuracy the required values of reference currents $I_{n-1}$ and $I_{n-2}$ of only two high-order positions of the digital-analog converters 9 and 10, while reference currents of the next following positions are so selected that the following relation is satisfied with a higher accuracy:

$$I_{n-3} + I_{n-2} = I_{n-1}$$
$$I_{n-4} + I_{n-3} = I_{n-2}$$
$$\cdots\cdots\cdots\cdots$$
$$I_0 + I_1 = I_2$$

For example, when an 8-digit digital-analog converter is subject to metrological test, it is sufficient to see if the following relations between reference currents I (with p = 1) exist:

$$I_7 = I_6 + I_5 = I_6 + I_4 + I_3 = I_6 + I_4 + I_2 + I_1 = I_6 + I_4 + I_2 + I_0$$

According to the invention, the entire transient that occurs during the replacement of adjacent codewords is broken down into a number of convolutions (each corresponding to a microtransient performed successively on bit positions so that each convolution involves only three bit positions to be switched over concurrently. This tends to reduce the action of the entire transient on the deflection components of the display and to reduce its recovery time with the result that the repetition rate of count pulses is increased and the sweep speed of the beam is increased too.

The transient outputs 18 and 19 of the pulse counters 6 and 7 provide for the blanking of the beam during transients so that a better pattern quality is obtained without reducing the sweep speed.

What is claimed is:
1. A cathode ray tube comprising,
   a control unit having an intensity control output, a horizontal sweep control output, a vertical sweep control output, and a fault acknowledgement input;
   an intensity control unit having a data input, a blanking input, and an output;
   a first pulse counter which is able to perform Fibonacci code operations;
   a second pulse counter which is able to perform Fibonacci code operations;
   each of said pulse counters having a data output, a fault acknowledgement output, a transient output, and a counting output;
   a first digital-analog converter which is able to perform Fibonacci code operations;
   a second digital-converter which is able to perform Fibonacci code operations;
   each of said digital-analog converters having an input and an output;
   a first pulse amplifier having an input and an output;
   a second pulse amplifier having an input and an output;
   a cathode-ray tube having a data input, a horizontal sweep input, and a vertical sweep input;
   a checking OR gate having two inputs and an output;
   a blanking OR gate having two inputs and an output;
   said intensity control output, said horizontal sweep control output, and said vertical sweep control output coupled, respectively, to said data input of said intensity control unit, to said counting input of said first pulse counter, and to said counting input of said second pulse counter;
   said data outputs of said first and second pulse counters, coupled to said inputs of said first and second digital-analog converters, respectively;
   said outputs of said first and second digital-analog converters, coupled to said inputs of said first and second pulse amplifiers, respectively;
   said outputs of said first and second pulse amplifiers, coupled, respectively, to said horizontal sweep input and to said vertical sweep input of said cathode-ray tube;
   said inputs of said checking OR gate, coupled to said fault acknowledgement outputs of said first and second pulse counters;
   said output of said checking OR gate, coupled to said fault acknowledgement input of said control unit;
   said inputs of said blanking OR gate, coupled to said transient outputs of said first and second pulse counters;
   said output of said blanking OR gate, coupled to said blanking input of said intensity control unit.

* * * * *